United States Patent
Hashida et al.

(10) Patent No.: US 8,624,651 B2
(45) Date of Patent: Jan. 7, 2014

(54) INTERPOLATION CIRCUIT AND RECEIVING CIRCUIT

(71) Applicant: Fujitsu Limited, Kawasaki (JP)

(72) Inventors: Takushi Hashida, Kawasaki (JP); Yoshiyasu Doi, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/709,481

(22) Filed: Dec. 10, 2012

(65) Prior Publication Data

US 2013/0249600 A1    Sep. 26, 2013

(30) Foreign Application Priority Data

Mar. 26, 2012    (JP) .................................. 2012-070352

(51) Int. Cl.
  *H03H 11/16*    (2006.01)

(52) U.S. Cl.
  USPC ......................................... 327/231; 327/236

(58) Field of Classification Search
  USPC ........... 327/231, 233–236; 375/308, 334–336
  See application file for complete search history.

(56) References Cited

U.S. PATENT DOCUMENTS

| | | | |
|---|---|---|---|
| 5,539,782 A * | 7/1996 | Shin et al. | 375/355 |
| 7,421,017 B2 * | 9/2008 | Takatsu | 375/232 |
| 2008/0304599 A1 | 12/2008 | Furtner | |

FOREIGN PATENT DOCUMENTS

| | | |
|---|---|---|
| JP | 11-68727 | 3/1999 |
| JP | 2004-229068 | 8/2004 |
| JP | 2008-526073 | 7/2008 |

* cited by examiner

*Primary Examiner* — An Luu
(74) *Attorney, Agent, or Firm* — Fujitsu Patent Center

(57) ABSTRACT

An interpolation circuit includes: a generation circuit that generates interpolation data from a plurality of pieces of input data, using an interpolation coefficient, among input data inputted in time series including a data point and a transition point; a detection circuit that detects that the input data lacks at the data point; and a coefficient circuit that changes the interpolation coefficient for each given data interval, and skips a position for changing the interpolation coefficient to the transition point when the detection circuit detects the lack of the input data.

8 Claims, 21 Drawing Sheets

FIG. 5

| Dn-1 | En | Dn | Late | Early |
|---|---|---|---|---|
| 0 | 0 | 0 | 0 | 0 |
| 0 | 0 | 1 | 0 | 1 |
| 0 | 1 | 0 | 1 | 1 |
| 0 | 1 | 1 | 1 | 0 |
| 1 | 0 | 0 | 1 | 0 |
| 1 | 0 | 1 | 1 | 1 |
| 1 | 1 | 0 | 0 | 1 |
| 1 | 1 | 1 | 0 | 0 |

US 8,624,651 B2

INTERPOLATION CIRCUIT AND RECEIVING CIRCUIT

CROSS-REFERENCE TO RELATED APPLICATION

This application is based upon and claims the benefit of priority of the prior Japanese Patent Application No. 2012-070352, filed on Mar. 26, 2012, the entire contents of which are incorporated herein by reference.

FIELD

A certain aspect of the embodiments discussed herein is related to an interpolation circuit and a receiving circuit.

BACKGROUND

As the performance of an information processing device, such as a device for communication base and a server, improves, the data rate of transmission and reception of signals inside and outside such a device is increasing. In a receiving circuit of such a transmission and reception device, there are a synchronous receiving circuit that samples input data in synchronization with the phase of the input data, and an asynchronous receiving circuit that samples input data without synchronizing with the phase of the input data. The asynchronous receiving circuit generates receive data from the sampled data by interpolation.

There has been known a technique that samples a data signal whenever a constant amount of phase is shifted, and selects data on the most desirable phase (see Japanese Laid-Open Patent Publication No. 11-68727). There has been known a technique that measures a cycle which receives a special mark from transmitted data with the special mark, and that delays a sampling clock based on the cycle (see Japanese Laid-Open Patent Publication No. 2004-229068). There has been known a technique that delays a sampling clock, and uses multiphase sampling clocks in which phases are different from each other (see Japanese National Publication of International Patent Application No. 2008-526073).

SUMMARY

According to an aspect of the present invention, there is provided an interpolation circuit including: a generation circuit that generates interpolation data from a plurality of pieces of input data, using an interpolation coefficient, among input data inputted in time series including a data point and a transition point; a detection circuit that detects that the input data lacks at the data point; and a coefficient circuit that changes the interpolation coefficient for each given data interval, and skips a position for changing the interpolation coefficient to the transition point when the detection circuit detects the lack of the input data.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 5 is a truth table of the phase detection circuit;

DESCRIPTION OF EMBODIMENTS

A description will be given of embodiments of the invention, with reference to drawings.

Embodiment 1

Figure 1A:
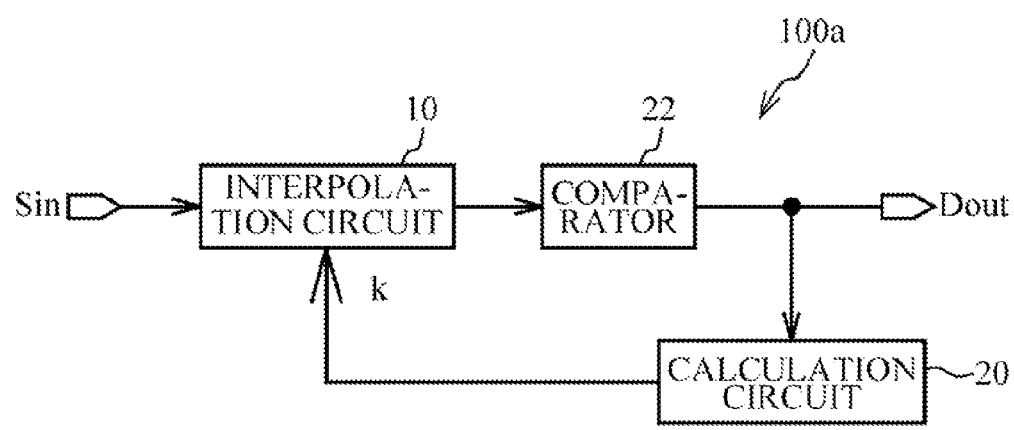
FIG. 1A is a block diagram of a receiving circuit according to a comparative embodiment.
Figure 1B:
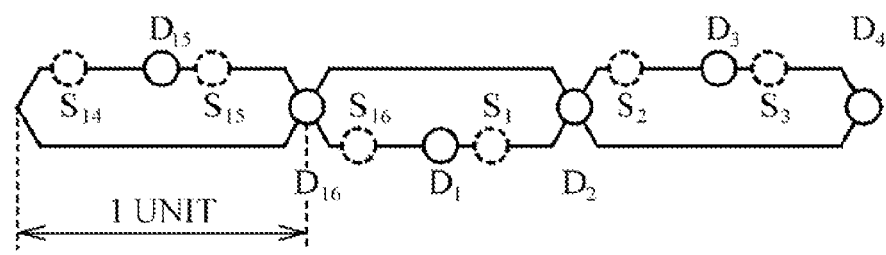
FIG. 1B is a diagram illustrating a sampling method.

First, a description will be given of an asynchronous receiving circuit. FIG. 1A is a block diagram of a receiving circuit according to a comparative embodiment. FIG. 1B is a diagram illustrating a sampling method. As illustrated in FIG.

1A, a receiving circuit 100a of the comparative embodiment includes an interpolation circuit 10, a calculation circuit 20 and a comparator 22. The interpolation circuit 10 generates interpolation data from input data Sin using an interpolation coefficient k. The comparator 22 generates receive data Dout by comparing the interpolation data with a reference value. The calculation circuit 20 detects phase information from the receive data, and calculates an interpolation code as the interpolation coefficient k. For example, a CDR (Clock Data Recovery) circuit can be used as the calculation circuit 20.

FIG. 1B illustrates signals with respect to time. In the comparative embodiment and the following embodiments, a 2× system in which two pieces of data per one unit are sampled is explained as an example, but the comparative embodiment and the following embodiments are applicable to other systems. Codes "Sn" in FIG. 1B correspond to the input data inputted in the time series. The interpolation circuit 10 generates a piece of interpolation data Dn from two pieces of input data Sn−1 and Sn. When the interpolation coefficient k is set as 0≤k≤1, the interpolation data Dn can be generated depending on a formula "Dn=(1−k)×Sn−1+k×Sn". Thereby, the interpolation data which corresponds with the phase of the input data can be generated. Thus, the interpolation coefficient k is a coefficient for weighting of the input data. In the 2× system, a plurality of pieces of data are located at data points and transition points. For example, in FIG. 1B, the pieces of data D15, D1 and D3 are located at the data points, and the pieces of data D16 and D2 are located at the transition points.

Next, a description will be given of a problem of the asynchronous receiving circuit. In the asynchronous receiving circuit, a frequency $f_{data}$ of the input data and a sampling frequency $f_{sample}$ may differ from each other. When the frequency $f_{data}$ is more than the frequency $f_{sample}$, there is timing that the interpolation coefficient k is changed from 0 to 1. When the frequency $f_{data}$ is less than the frequency $f_{sample}$, there is timing that the interpolation coefficient k is changed from 1 to 0.

Figure 2A:
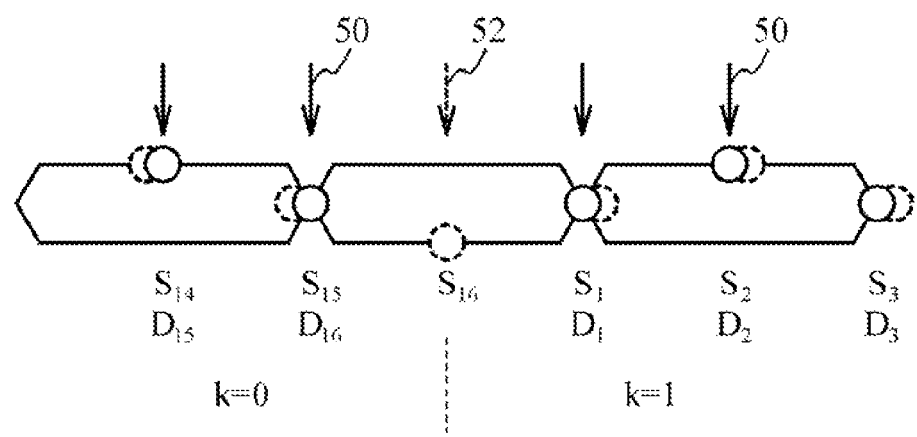
FIG. 2A is a diagram illustrating a signal with respect to a time in timing when an interpolation coefficient k is changed from 0 to 1.
Figure 2B:
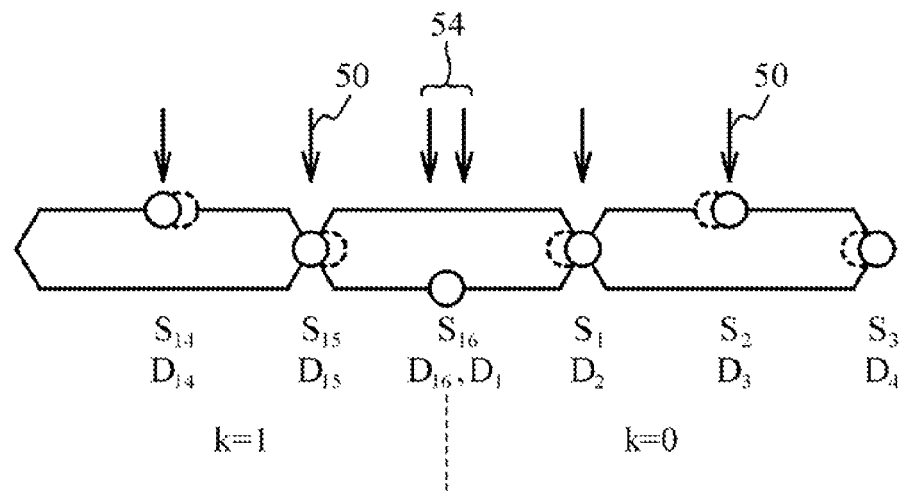
FIG. 2B is a diagram illustrating a signal with respect to a time in timing when the interpolation coefficient k is changed from 1 to 0.

FIG. 2A is a diagram illustrating a signal with respect to a time in timing when the interpolation coefficient k is changed from 0 to 1, and FIG. 2B is a diagram illustrating a signal with respect to a time in timing when the interpolation coefficient k is changed from 1 to 0. It is assumed that, in FIG. 2A, the interpolation coefficient k is changed from 0 to 1 when the input data S16 is processed. The interpolation data and the input data are overlapped mostly. Until inputting the input data S16, the input data Sn−1 is sampled as the interpolation data Dn. When the input data S16 is inputted, the interpolation data is not generated. When and after the input data S1 is inputted, the input data Sn is sampled as the interpolation data Dn. Thus, the input data Sn other than the input data S16 are sampled as the interpolation data Dn as illustrated by arrows 50, but the input data S16 is not sampled as the interpolation data as illustrated by a dotted arrow 52. Therefore, the interpolation data lacks. It is assumed that, in FIG. 2B, the interpolation coefficient k is changed from 1 to 0 when the input data S16 is processed. The interpolation data and the input data are overlapped mostly. Until inputting the input data S16, the input data Sn is sampled as the interpolation data Dn. When the input data S16 is inputted, the interpolation data D16 and D1 are generated. When and after the input data S1 is inputted, the input data Sn is sampled as the interpolation data Dn+1. Thus, the input data other than the input data S16 are sampled as the interpolation data as illustrated by arrows 50, but the input data S16 is sampled as the overlapped interpolation data D16 and D1 as illustrated by arrows 54.

As described above, in the receiving circuit of the comparative embodiment, a cycle slip in which the interpolation data lacks may occur. A method to increase the sampling frequency and perform oversampling is considered as a method to restrain the lack of data. For example, the sampling frequency is set to 10 times of the frequency of the input data. Thereby, the number of samples per one unit increases more than the number of samples calculated in the comparative embodiment (e.g. the number of samples is two in the case of the 2× system). Therefore, even when the lack of data occurs, the lacked data can be added by selecting another data according to need. However, even if the oversampling for high-speed data communication more than 10 Gbps or more than 1 Gbps is used, it is difficult to perform the sampling of the high frequency. Even when the sampling of the high frequency can be performed, a power consumption increases since an operating frequency becomes high.

A method to adjust the sampling frequency so that the sampling frequency is always higher than the frequency of the input data is considered as the method to restrain the lack of data. However, in this method, the independent oscillators are provided in a transmitting side and a receiving side. Therefore, the device becomes large in size, and the power consumption increases.

In the following description, a first embodiment which restrains the lack of the interpolation data without using the above-mentioned method is described.

Figure 3:
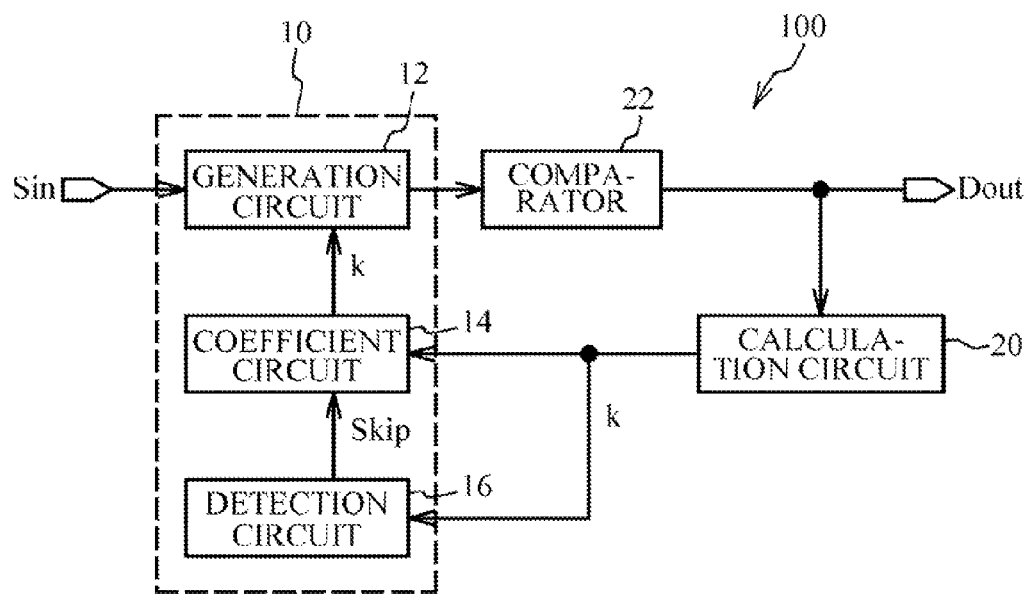
FIG. 3 is a block diagram of a receiving circuit according to a first embodiment.

FIG. 3 is a block diagram of a receiving circuit according to the first embodiment. As illustrated in FIG. 3, a receiving circuit 100 includes the interpolation circuit 10, the calculation circuit 20 and the comparator 22. The interpolation circuit 10 includes a generation circuit 12, a coefficient circuit 14 and a detection circuit 16. The generation circuit 12 generates the interpolation data based on a plurality pieces of data among data inputted in time series, using an interpolation coefficient k. The data inputted in time series includes the data point and the transition point. The detection circuit 16 detects that the input data lacks at a data point, and outputs the result of the detection to the coefficient circuit 14 as a signal Skip. The coefficient circuit 14 changes the interpolation coefficient k for each given data interval. When the detection circuit 16 detects the lack of the input data, the coefficient circuit 14 skips a position for changing the interpolation coefficient k to the transition point.

Figure 4A:
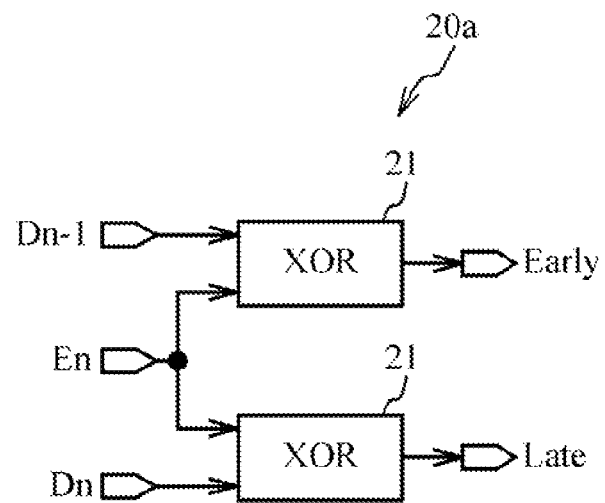
FIG. 4A is a diagram illustrating an example of a phase detection circuit.
Figure 4B:
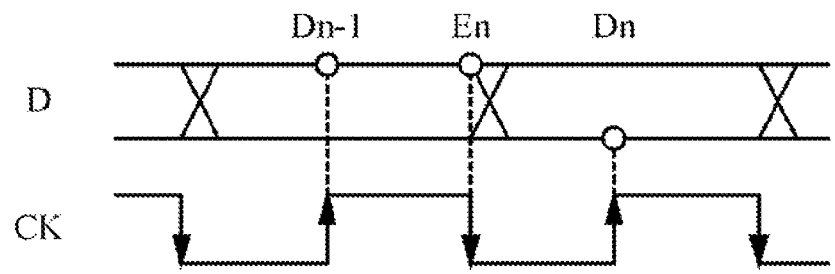
FIG. 4B is a diagram illustrating a signal with respect to a time in the case where data is advanced with respect to a clock.
Figure 4C:
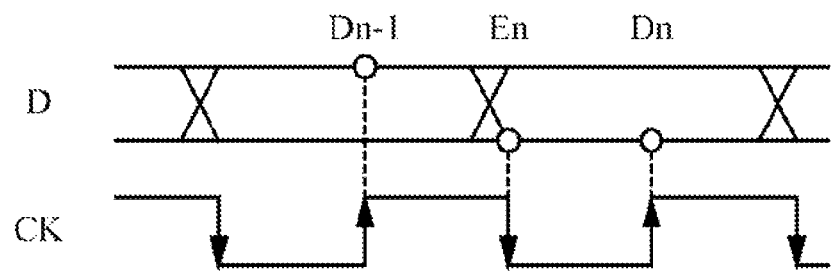
FIG. 4C is a diagram illustrating a signal with respect to a time in the case where data is delayed with respect to the clock.

Next, a role of the transition point is explained. FIG. 4A is a block diagram illustrating an example of a phase detection circuit. FIG. 4B is a diagram illustrating a signal with respect to a time in the case where data is advanced with respect to a clock. FIG. 4C is a diagram illustrating a signal with respect to a time in the case where data is delayed with respect to the clock. FIG. 5 is a truth table of a phase detection circuit. A phase detection circuit 20a is an Alexander phase detector, and includes two XOR-circuits 21, as illustrated in FIG. 4A. Data Dn−1 on the data point and data En on the transition point are inputted to one XOR-circuit 21, and data Dn on the data point and the data En on the transition point are inputted to another XOR-circuit 21. A signal "Early" is outputted from the one XOR-circuit 21, and a signal "Late" is outputted from the another XOR-circuit 21.

As illustrated in FIG. 4B, the data D is advanced with respect to a clock CK. In this case, the pieces of data Dn, En and Dn−1 are 1, 1 and 0, respectively. As illustrated in FIG. 4C, the data D is delayed with respect to the clock CK. In this case, the pieces of data Dn, En and Dn−1 are 1, 0 and 0, respectively. As described above, according to the data En on the transition point, it is possible to detect whether the data D is advanced or delayed with respect to the clock CK.

When the data Dn−1 on the data point and the data D on the data point are 1 or 0 at the same time, as illustrated in FIG. 5, it is not possible to detect whether the data D is advanced or delayed with respect to the clock CK. When the data Dn−1 on the data point and the data D on the data point are different from each other, and the signal "Early" is 1, the data D is advanced with respect to the clock CK. When the data Dn−1 on the data point and the data D on the data point are different from each other, and the signal "Late" is 1, the data D is delayed with respect to the clock CK. The Alexander phase detector is effective in the case of the 2× system. When the transition of the data point is performed, the phase detection can be preformed. The Alexander phase detector is one example, and uses the data on the transition point when the calculation circuit 20 detects a phase difference between the data and the clock. Thus, in the system which samples the transition point, the data on the transition point is used for the phase detection. Therefore, all the pieces of data on the transition points do not need to be sampled. For example, the data on the transition point may lack.

Figure 6A:
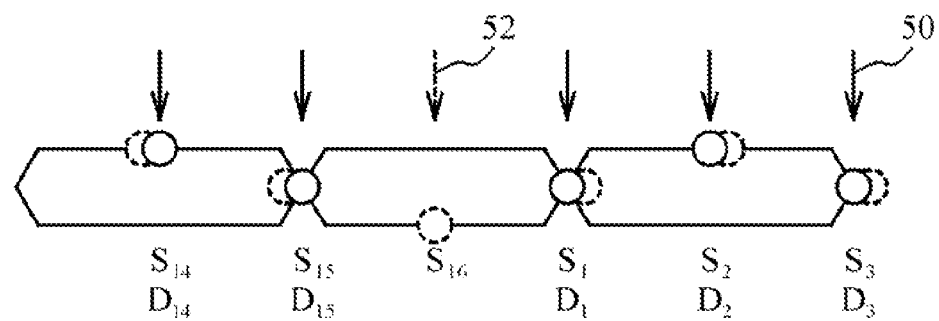
FIGS. 6A to 6C are diagrams illustrating a signal with respect to a time in timing when the interpolation coefficient k is changed from 0 to 1.
Figure 6B:
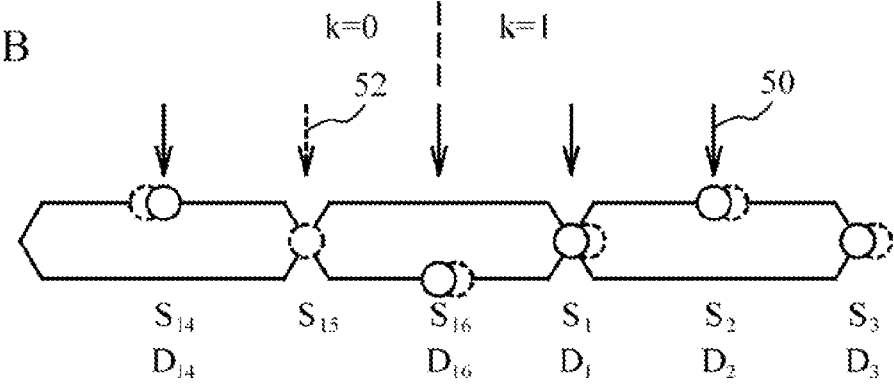
Figure 6C:
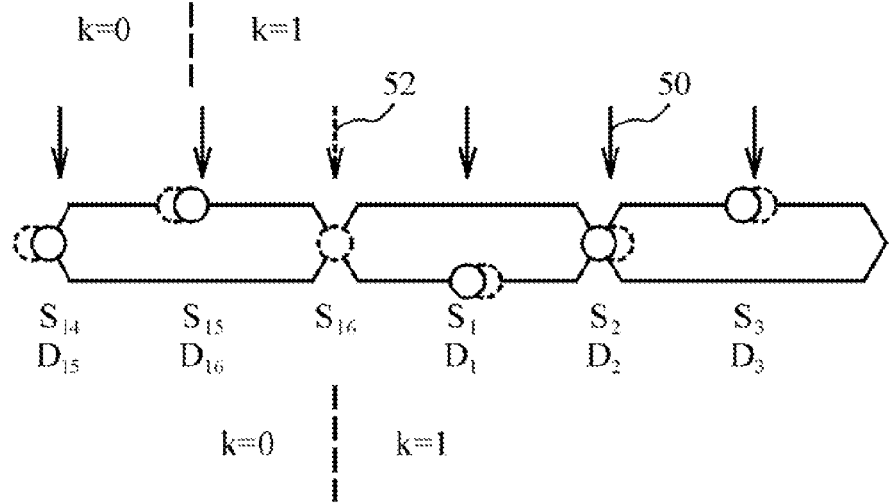

FIGS. 6A to 6C are diagrams illustrating a signal with respect to a time in timing when the interpolation coefficient k is changed from 0 to 1. In the input data S16, the interpolation coefficient k is changed from 0 to 1, as illustrated in FIG. 6A. In this case, the interpolation circuit of the second embodiment described later does not really sample the input data S16. That is, the input data S16 lacks. In the first embodiment, when the detection circuit 16 detects the lack of the input data S16 at the data point as illustrated in FIG. 6B, the coefficient circuit 14 skips the position for changing the interpolation coefficient k to the transition point. For example, the coefficient circuit 14 skips the position for changing the interpolation coefficient k to the transition point so that the interpolation coefficient k is changed from 0 to 1 at the position of the input data S15. Thereby, the input data to be lacked is the input data S15 on the transition point. On the contrary, when a position where the input data lacks is the transition point as illustrated in FIG. 6C, the coefficient circuit 14 does not skip the position for changing the interpolation coefficient k.

Figure 7A:
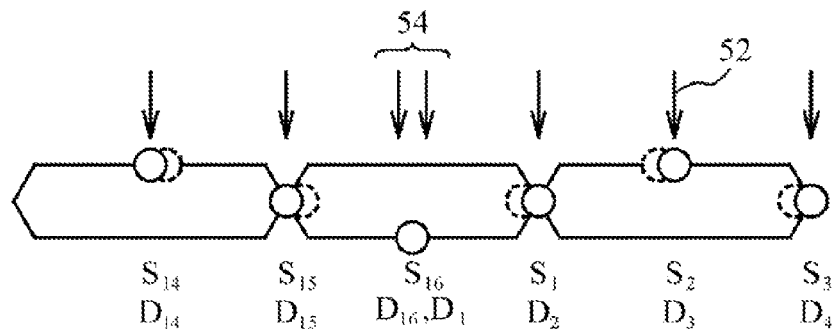
FIGS. 7A to 7C are diagrams illustrating a signal with respect to a time in timing when the interpolation coefficient k is changed from 1 to 0.
Figure 7B:
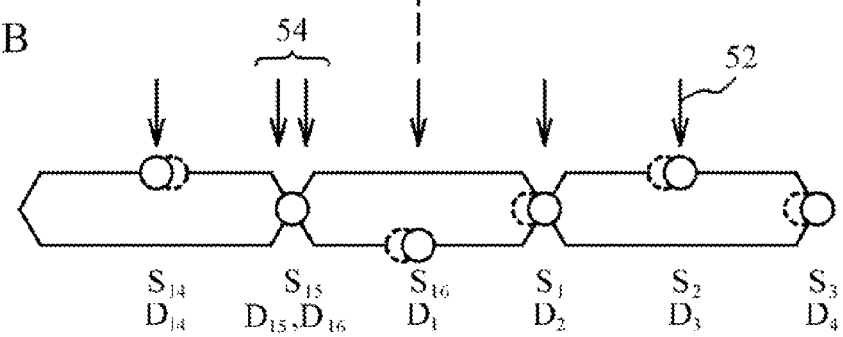
Figure 7C:
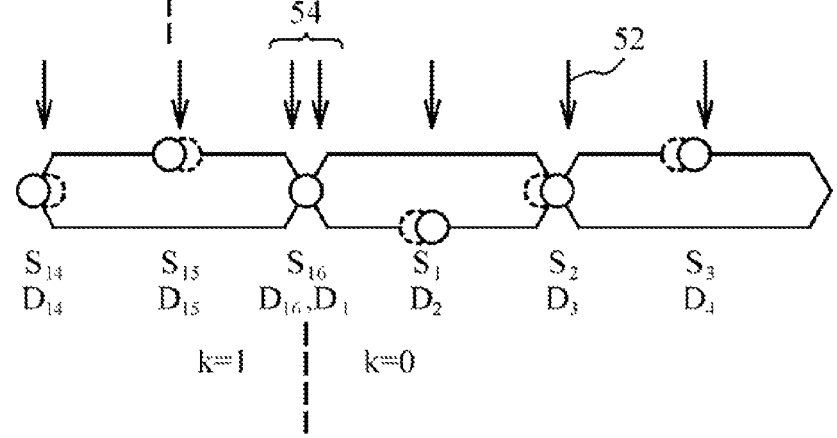

FIGS. 7A to 7C are diagrams illustrating a signal with respect to a time in timing when the interpolation coefficient k is changed from 1 to 0. In the input data S16, the interpolation coefficient k is changed from 0 to 1, as illustrated in FIG. 7A. In this case, the input data S16 are doubly sampled as the interpolation data D16 and D1. When the input data are doubly sampled, there is a case where the interpolation data is incorrect. For example, in the interpolation circuit of the second embodiment described later, both of the doubly sampled data are incorrect. In the first embodiment, when the detection circuit 16 detects that the interpolation data are doubly generated from the input data, the coefficient circuit 14 skips the position for changing the interpolation coefficient k to the transition point, as illustrated in FIG. 7B. For example, the coefficient circuit 14 skips the position for changing the interpolation coefficient k to the transition point so that the interpolation coefficient k is changed from 1 to 0 at the position of the input data S15. Thereby, the input data to be doubly sampled is the input data on the transition point. On the contrary, when a position where the input data to be doubly sampled as two pieces of interpolation data is the transition point as illustrated in FIG. 7C, the coefficient circuit 14 does not skip the position for changing the interpolation coefficient k.

According to the first embodiment, when the detection circuit 16 detects the lack of the input data, the coefficient circuit 14 skips the position for changing the interpolation coefficient k to the transition point, as illustrated in FIGS. 6A to 6C. Thereby, the data on the transition point can be set as the input data to be lacked, instead of the data on the data point. Therefore, the input data to be lacked can be set as data with little influence as the receive data.

When detection circuit 16 detects that the interpolation data are doubly generated from the input data, the coefficient circuit 14 skips the position for changing the interpolation coefficient k to the transition point, as illustrated in FIGS. 7A to 7C. Thereby, the data on the transition point can be set as the input data to be doubly and incorrectly sampled, instead of the data on the data point. Therefore, the incorrect data can be set as the data with little influence as the receive data.

Embodiment 2

Figure 8:
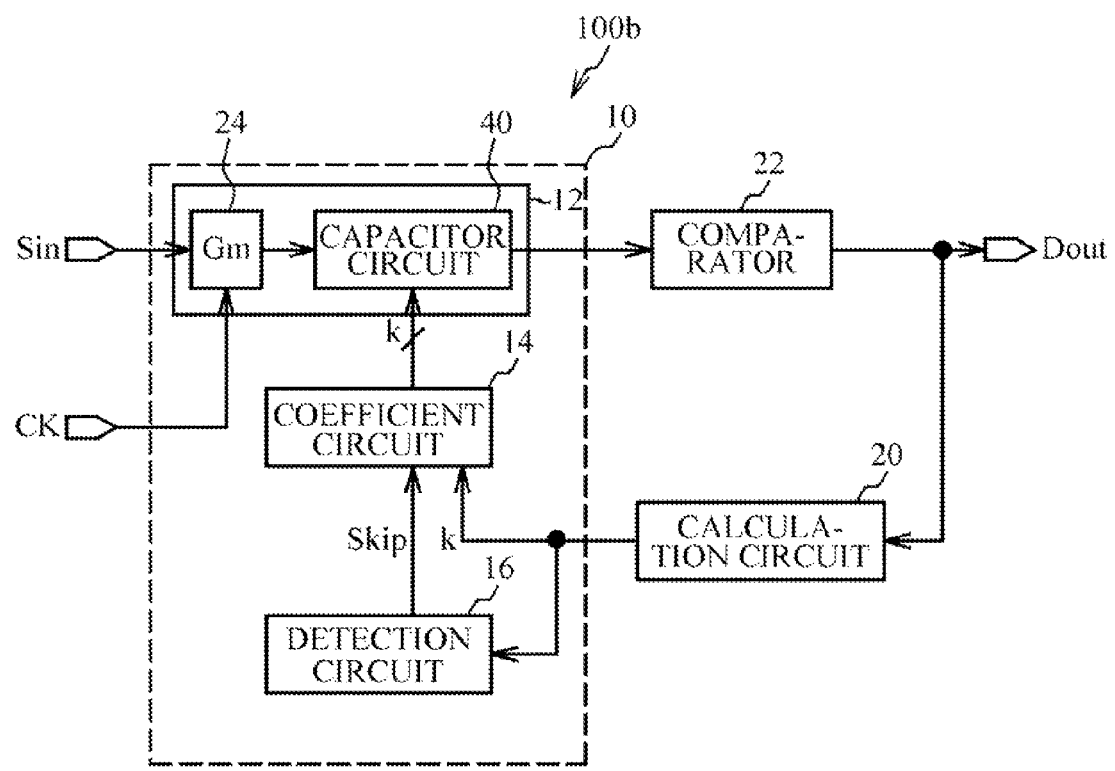
FIG. 8 is a block diagram of the receiving circuit according to a second embodiment.

FIG. 8 is a block diagram of the receiving circuit according to a second embodiment. In a receiving circuit 100b, the generation circuit 12 includes a Gm circuit 24 and a capacitor circuit 40. A clock signal for sampling is inputted to the generation circuit 12. The Gm circuit 24 converts a voltage into a current. Other configurations are the same as those of the first embodiment of FIG. 3, and hence a description thereof is omitted.

Figure 9:
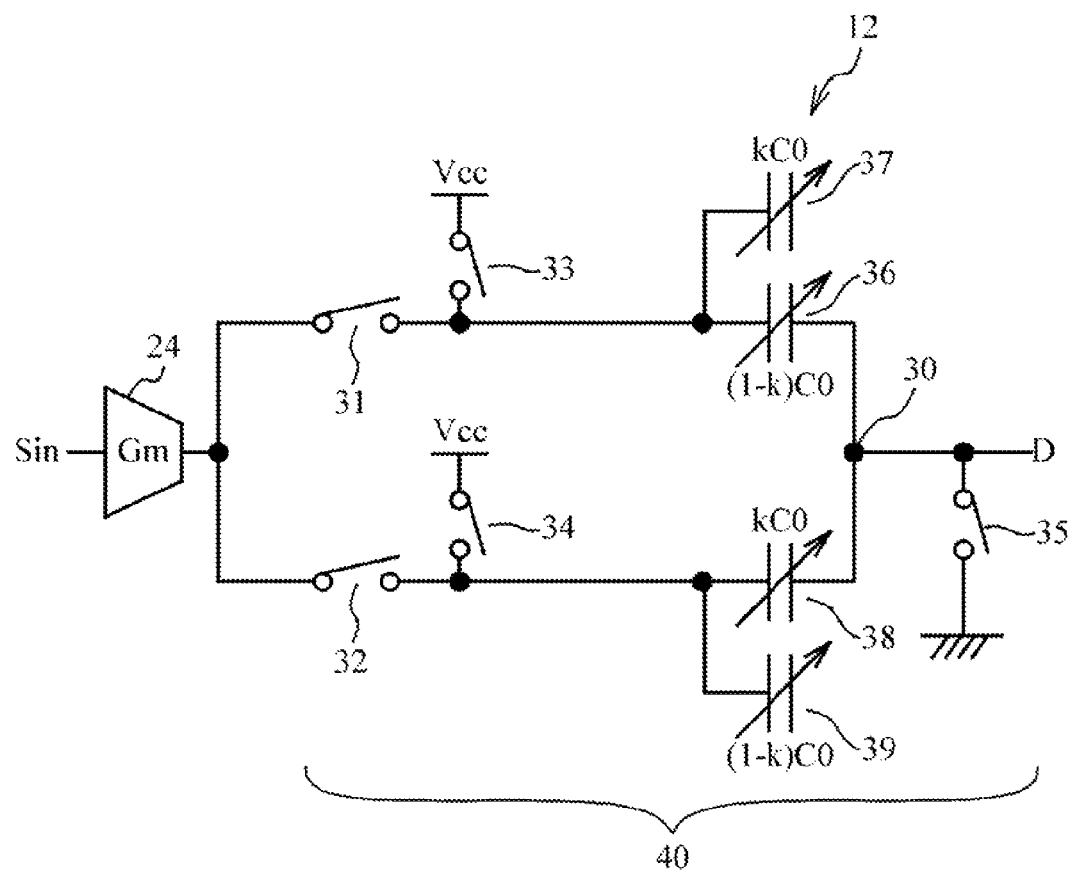
FIG. 9 is a circuit diagram illustrating a switched capacitor circuit.

FIG. 9 is a circuit diagram illustrating a switched capacitor circuit. As illustrated in FIG. 9, the generation circuit 12 includes a Gm circuit 24 and a capacitor circuit 40. The capacitor circuit 40 includes switches 31 to 35, and variable capacitors 36 to 39. The input data Sin which is a voltage signal is inputted to the Gm circuit 24. The Gm circuit 24 converts the voltage signal into a current signal. The output of the Gm circuit 24 is inputted to one ends of the variable capacitors 36 and 38 via the switches 31 and 32, respectively. Other ends of the variable capacitors 36 and 38 are synthesized at a synthesis node 30. The synthesis node 30 outputs interpolation data D. The switches 33 and 34 are connected between one ends of the variable capacitors 36 and 38, and a power supply Vcc, respectively. The switch 35 is connected between the synthesis node 30 and a ground. The variable capacitors 37 and 39 are connected in parallel with the variable capacitors 36 and 38, respectively. When a capacitance value of the variable capacitor 36 is "(1−k)C0", the capacitance value of the variable capacitor 37 is "KC0". When the capacitance value of the variable capacitor 38 is "KC0", the capacitance value of the variable capacitor 39 is "(1−k)C0". Thus, regardless of the interpolation coefficient k, the sum of capacitance values of the variable capacitors 36 and 37 is constant. Regardless of the interpolation coefficient k, the sum of capacitance values of the variable capacitors 38 and 39 is constant.

Figure 10:
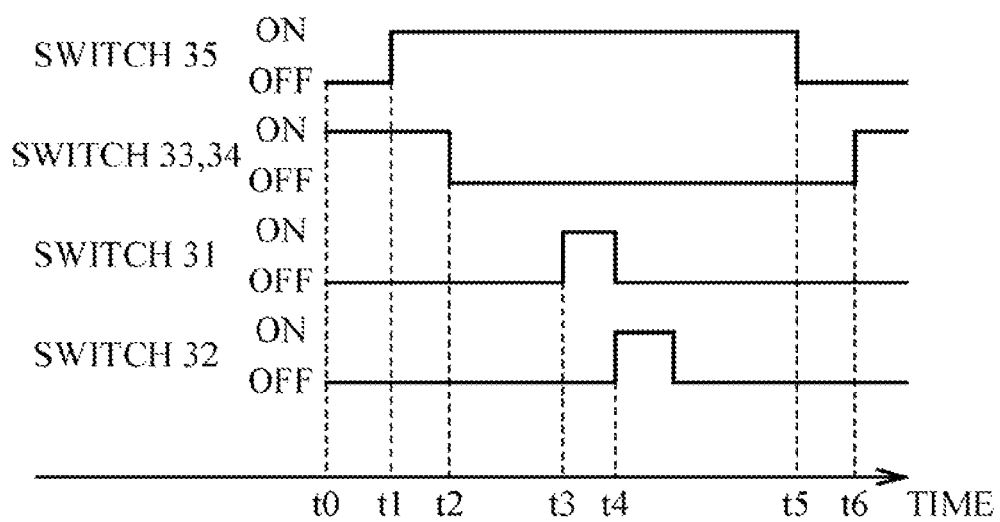
FIG. 10 is a timing chart illustrating the operation of each switch in the switched capacitor circuit.

FIG. 10 is a timing chart illustrating the operation of each switch in the switched capacitor circuit. Referring to FIG. 10, at a time t0, the switches 31, 32 and 35 are turned off, and the switches 33 and 34 are turned on. The switch 35 is turned on at a time t1, and the switches 33 and 34 are turned off at a time t2. The switch 31 is turned on for a certain period (e.g. 0.5 unit) from a time t3. An electric charge that has integrated a current value for the certain period is accumulated in the variable capacitor 36. A voltage which has multiplied the electric charge by the reciprocal of the capacitance value (1−k)C0 occurs between the variable capacitor 36. The switch 32 is turned on for a certain period (e.g. 0.5 unit) from a time t4. An electric charge that has integrated a current value for the certain period is accumulated in the variable capacitor 38. A voltage which has multiplied the electric charge by the reciprocal of the capacitance value kC0 occurs between the variable capacitor 38. The periods which turn on the switches 31 and 32 can be set freely. The switch 35 is turned off at a time t5. The switches 33 and 34 are turned on at a time t6. The switches 33 and 34 are turned on and the switch 35 is turned off, so that the electric charges accumulated in the variable capacitors 36 and 38 are changed to a standard of the power supply Vcc, and are synthesized at the synthesis node 30. The switches 31 and 32 are turned on at the time that the input data Sn−1 and Sn should be sampled, respectively, so that a voltage which is proportional to "(1−k)×Sn−1+k×Sn" is generated at the synthesis node 30 in a period (i.e., a period equivalent from the time t0 to the time t1) after the time t6. Thereby, the interpolation data corresponding to the Dn can be generated at the synthesis node.

As described above, in the capacitor circuit 40, the capacitance values of the variable capacitor 36 (i.e., a first variable capacitor) and the variable capacitor 38 (i.e., a second variable capacitor) are changeable according to the interpolation coefficient k. The switch 31 (i.e., a first switch) and the switch 32 (i.e., a second switch) apply currents corresponding to the input data Sn−1 and Sn to the variable capacitors 36 and 38 in timing when the variable capacitor 36 is earlier than the variable capacitor 38. The synthesis node 30 (i.e., a synthesis portion) generates the interpolation data Dn by synthesizing the electric charges of the variable capacitors 36 and 38. Thus, the interpolation data can be generated according to the interpolation coefficient k.

Here, the capacitance values of the variable capacitors 36 and 38 are changed so that the sum of the capacitance values of the variable capacitors 36 and 38 becomes constant. Thereby, the capacitance values of the variable capacitors 36 and 38 can be changed according to the interpolation coefficient k.

In the circuit illustrated in FIG. 9, only one interpolation data is generable as illustrated in FIG. 10. Therefore, the generation circuit 12 includes a plurality of capacitor circuits 40. Thereby, it is possible to generate sampling timing of each of data S1 to Sn, generate the interpolation data, and secure time to charge the variable capacitors 36 and 38.

Figure 11:
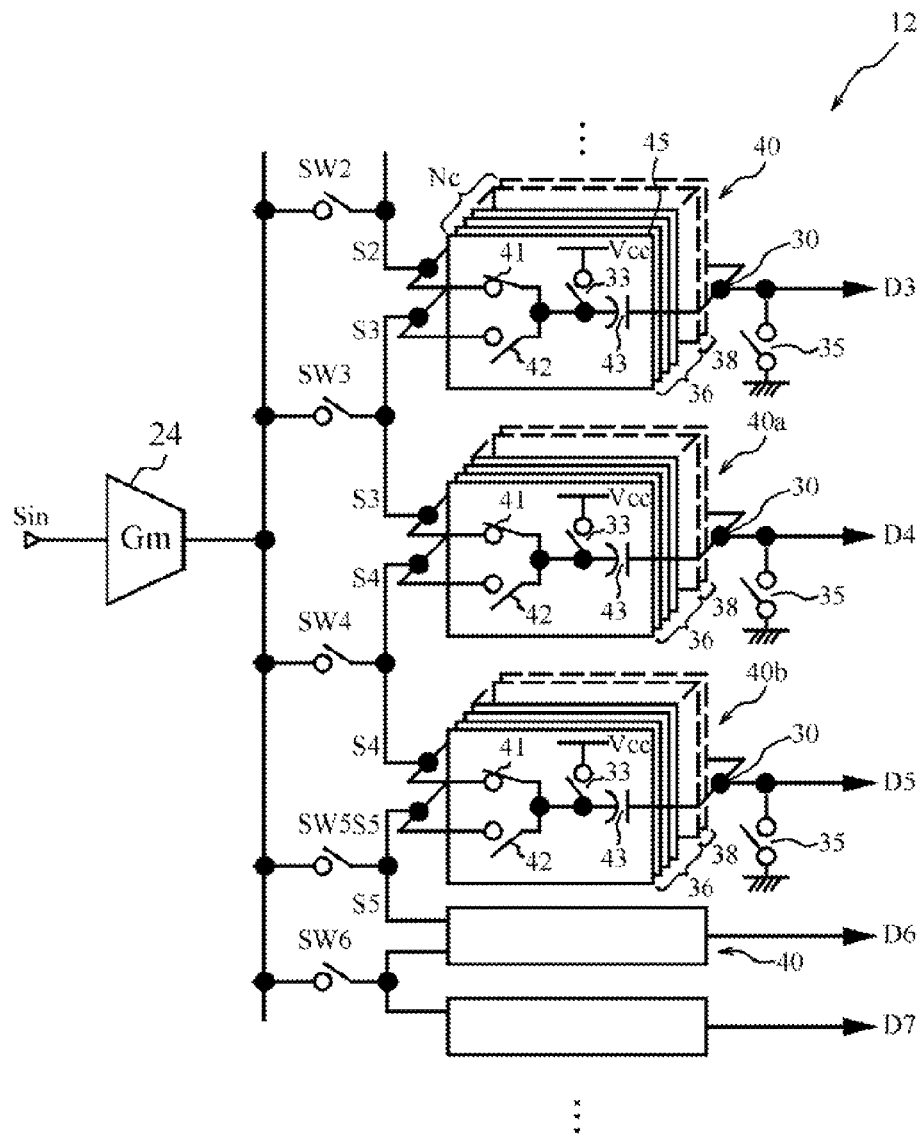
FIG. 11 is a circuit diagram illustrating a generation circuit that is provided with a plurality of capacitor circuits.

FIG. 11 is a circuit diagram illustrating a generation circuit that is provided with a plurality of capacitor circuits. Referring to FIG. 11, the generation circuit 12 includes the Gm circuit 24 and the plurality of capacitor circuits 40. The number of capacitor circuits 40 is "N". Each capacitor circuit 40 includes a plurality of slices 45 (e.g. the number of slices 45) is "Nc". Each of the slices 45 includes switches 33, 41 and 42, and a capacitor 43. The switch 41 is connected between a switch SWn−1 (n is a natural number from 1 to N) and one end of the capacitor 43. The switch 42 is connected between a switch SWn and the one end of the capacitor 43. Another end of the capacitor 43 is connected to the synthesis node 30. Each switch 33 is the same as the switch 33 in FIG. 9, and connected between the one end of the capacitor 43 and the power supply Vcc. The reason why the switch 33 is provided in each slice 45 is for making it possible to charge all the capacitors 43.

The Nc slices 45 are connected in parallel. The capacitance values of the capacitors 43 in the Nc slices 45 are the same as each other. The switches 41 and 42 are mutually and complementarily turned on and off. That is, when the switch 41 is turned on, the switch 42 is turned off. When the switch 41 is turned off, the switch 42 is turned on. Thereby, the capacitors 43 in the slices 45 in which the switches 41 are turned on are connected in parallel with the switch SWn−1, and correspond to the variable capacitor 36. The capacitors 43 in the slices 45 in which the switches 42 are turned on are connected in parallel with the switch SWn, and correspond to the variable capacitor 38. Therefore, the sum of the capacitance values of the variable capacitors 36 and 38 is the same as that of FIG. 9. In the following description, it is assumed that a variable kn is set as any one of 0 to Nc, the variable kn is 0 when the interpolation coefficient k is 0, and the variable kn is Nc when the interpolation coefficient k is 1. That is, the variable kn is expressed by "k×Nc". In the Nc slices 45, the switches 41 in (Nc−Kn) slices 45 are turned on, and Kn switches 42 are turned on. Thereby, the interpolation data Dn which is proportional to "(Nc−kn)/Nc×Sn−1+kn/Nc×Sn" is outputted to the synthesis node 30. In FIG. 11, the slices 45 included in the variable capacitor 36 are illustrated by solid lines, and the slices 45 included in the variable capacitor 38 are illustrated by dashed lines. Subsequent figures are also illustrated in the same manner as FIG. 11.

Figure 12:
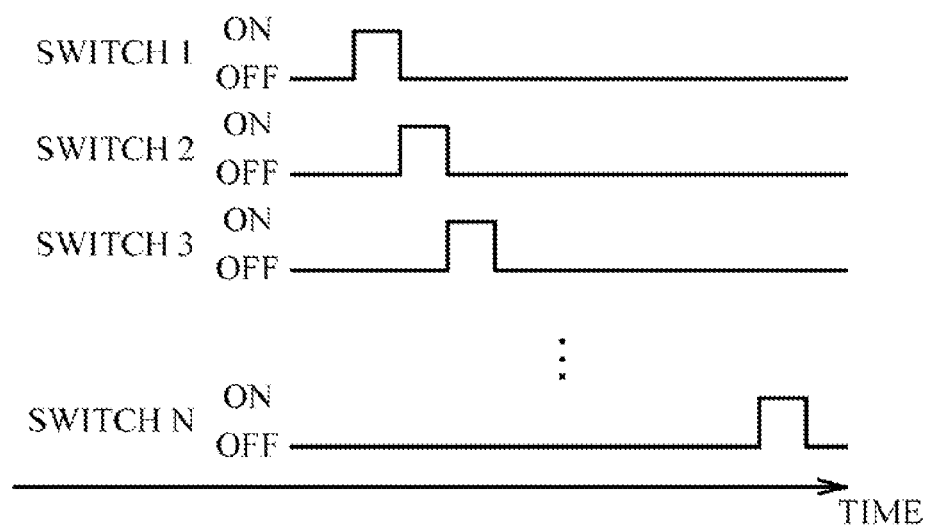
FIG. 12 is a timing chart of switches SW1 to SWN.

FIG. 12 is a timing chart of the switches SW1 to SWN. As illustrated in FIG. 12, the switches SW1 to SWN are turned on in timing corresponding to time-series data S1 to Sun, respectively. Thereby, the interpolation data D1 to DN can be generated in response to the time series.

As described above, the generation circuit 12 includes the plurality of capacitor circuits 40 corresponding to the plurality of pieces of data S1 to S16 within a given data interval. Here, a description is given of two capacitor circuits 40a and 40b corresponding to time-series adjacent data S3 and S4. The second variable capacitor 38 of one capacitor circuit (i.e., the capacitor circuit 40a) in the capacitor circuits 40a and 40b that corresponds to early data of the time-series data, and the first variable capacitor 36 of another capacitor circuit (i.e., the capacitor circuit 40b) in the capacitor circuits 40a and 40b have a switch SW4 in common. Thereby, a current is applied to the second variable capacitor 38 of the capacitor circuit 40a and the first variable capacitor 36 of the capacitor circuit 40b at the same time. Thus, since the switch SW4 is shared, the switch SW4 can supply data S4 to the capacitor circuits 40a and 40b.

When the capacitance values of the capacitors 43 in all capacitor circuits 40 are the same as each other, the current is supplied from the switch SW4 to kn capacitors 43 in the capacitor circuit 40a and (Nc−kn) capacitors 43 in the capacitor circuit 40b. With respect to the switch SW3, the current is supplied in the same manner as the switch SW4. The capacitance values of the capacitors as seen from the respective switches SW1 to SWN are the same as each other. Thereby, when the same currents flow to the capacitors 43 in the respective capacitor circuits 40, the same voltages occur. If the capacitance values of the capacitors as seen from the respective switches SW1 to SWN are different from each other, different voltages occur even when the same currents flow to the capacitors 43. Therefore, correct interpolation data is not generated.

Figure 13:
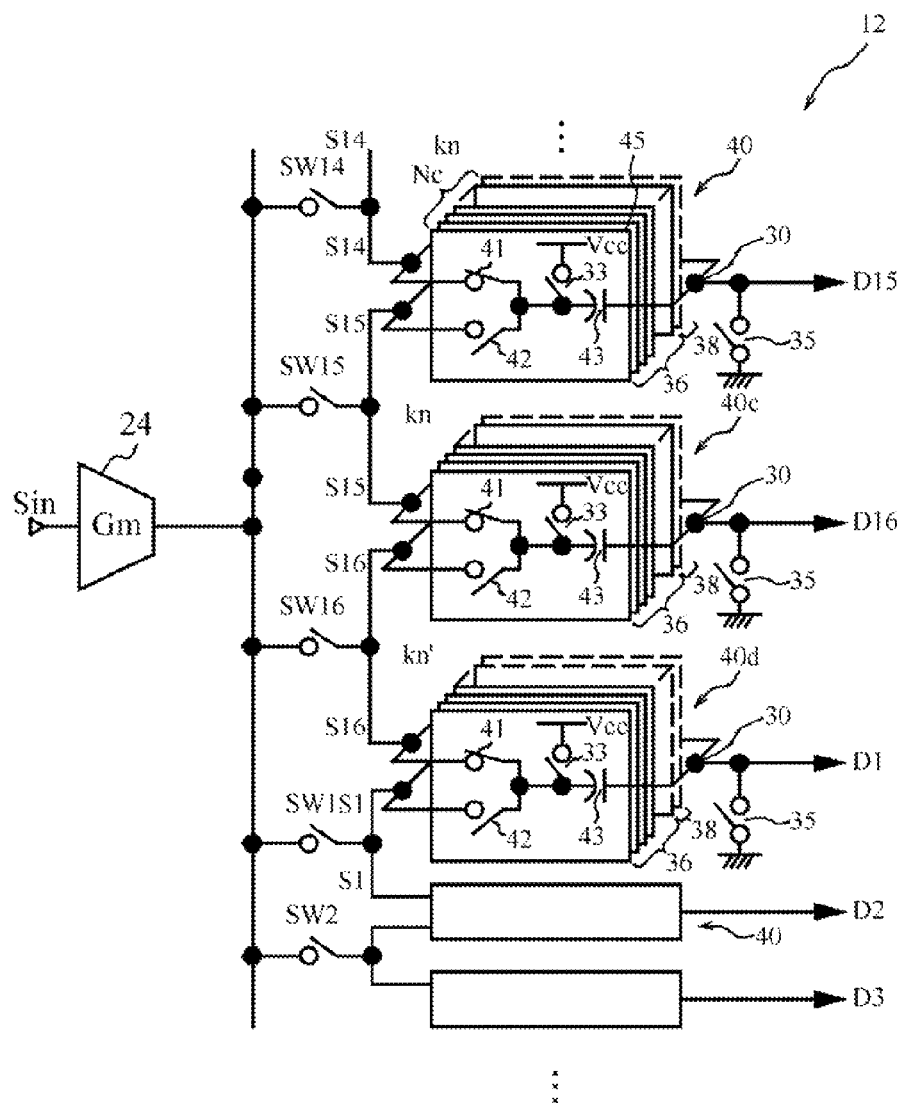
FIG. 13 is a diagram illustrating a case where an interpolation coefficient in the generation circuit is changed.

Next, a description is given of a case where the interpolation coefficient in the generation circuit 12 is changed. FIG. 13 is a diagram illustrating the case where the interpolation coefficient in the generation circuit 12 is changed. The circuitry of FIG. 13 is the same as that of FIG. 11. It is assumed that the timing that the coefficient circuit 14 changes the interpolation coefficient kn is for each given data interval (e.g. for each 16 data, or some data other than 16 data), and the interpolation coefficient is changed from kn to kn' between the capacitor circuits 40c and 40d. In the capacitor circuit 40c, the number of capacitors 43 connected to the switch SW15 is "Nc−1", and the number of capacitors 43 connected to the switch SW16 is "1". In the capacitor circuit 40d, the number of capacitors 43 connected to the switch SW16 is "Nc−2", and the number of capacitors 43 connected to the switch SW1 is "2". Thereby, the number of capacitors 43 seen from the switch SW16 is "Nc−1". Therefore, the interpolation data D16 and D1 generated using the input data S16 become incorrect.

Figure 14:
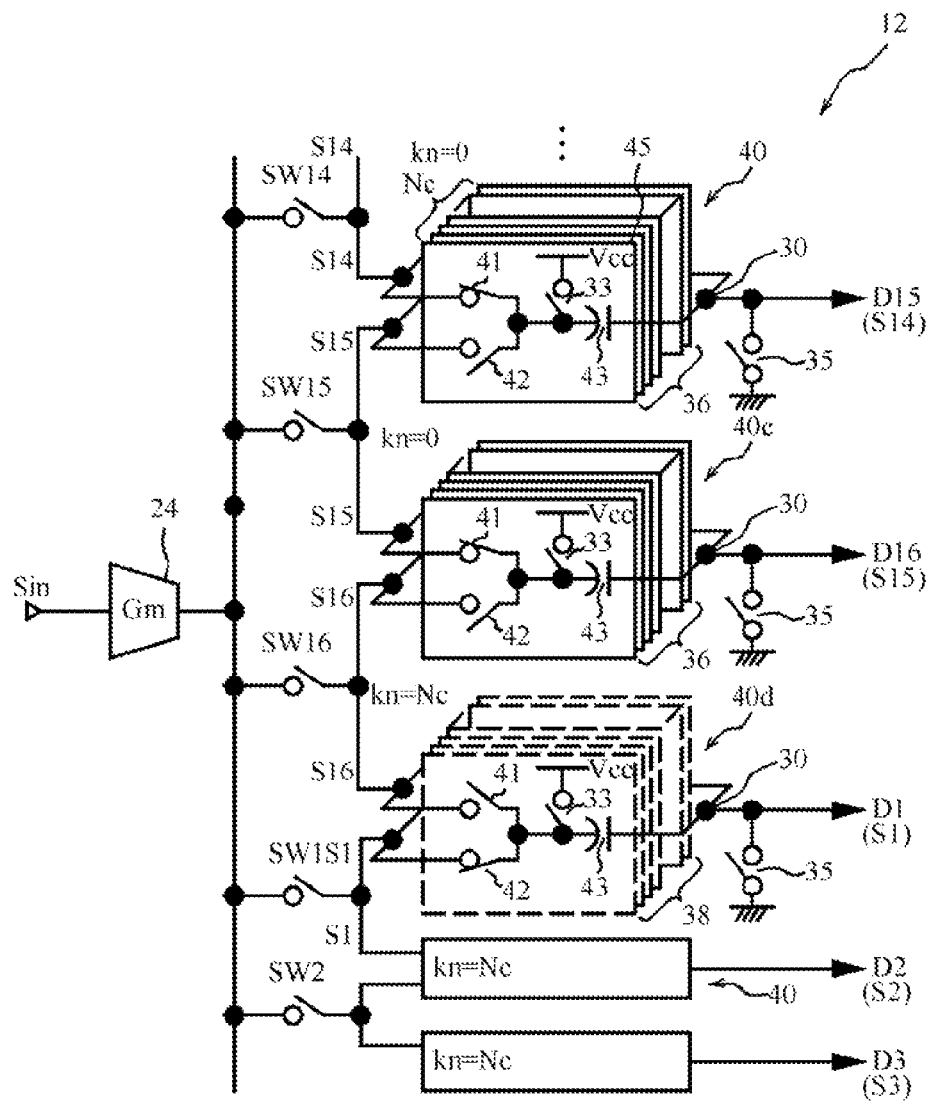
FIG. 14 is a diagram illustrating a case where the interpolation coefficient kn in the generation circuit is changed from 0 to Nc.

Next, a description is given of a case where the interpolation coefficient kn in the generation circuit 12 is changed from 0 to Nc. FIG. 14 is a diagram illustrating the case where the interpolation coefficient kn in the generation circuit 12 is changed from 0 to Nc. The circuitry of FIG. 14 is the same as that of FIG. 11. It is assumed that the interpolation coefficient kn is changed from 0 to Nc between the capacitor circuits 40c and 40d, for example. In the capacitor circuit 40c, all capacitors 43 are connected to the switch SW15, and the capacitors 43 are not connected to the switch SW16. In the capacitor circuit 40d, the capacitors 43 are not connected to the switch SW16, and all capacitors 43 are connected to the switch SW1. Thereby, the interpolation data D16 outputted from the capacitor circuit 40c corresponds to the data S15, and the interpolation data D1 outputted from the capacitor circuit 40d corresponds to the data S1. Therefore, the interpolation data corresponding to the data S16 is not outputted.

Thus, in the generation circuit 12 having the plurality of capacitor circuits 40, the lack of the input data occurs.

Figure 15:
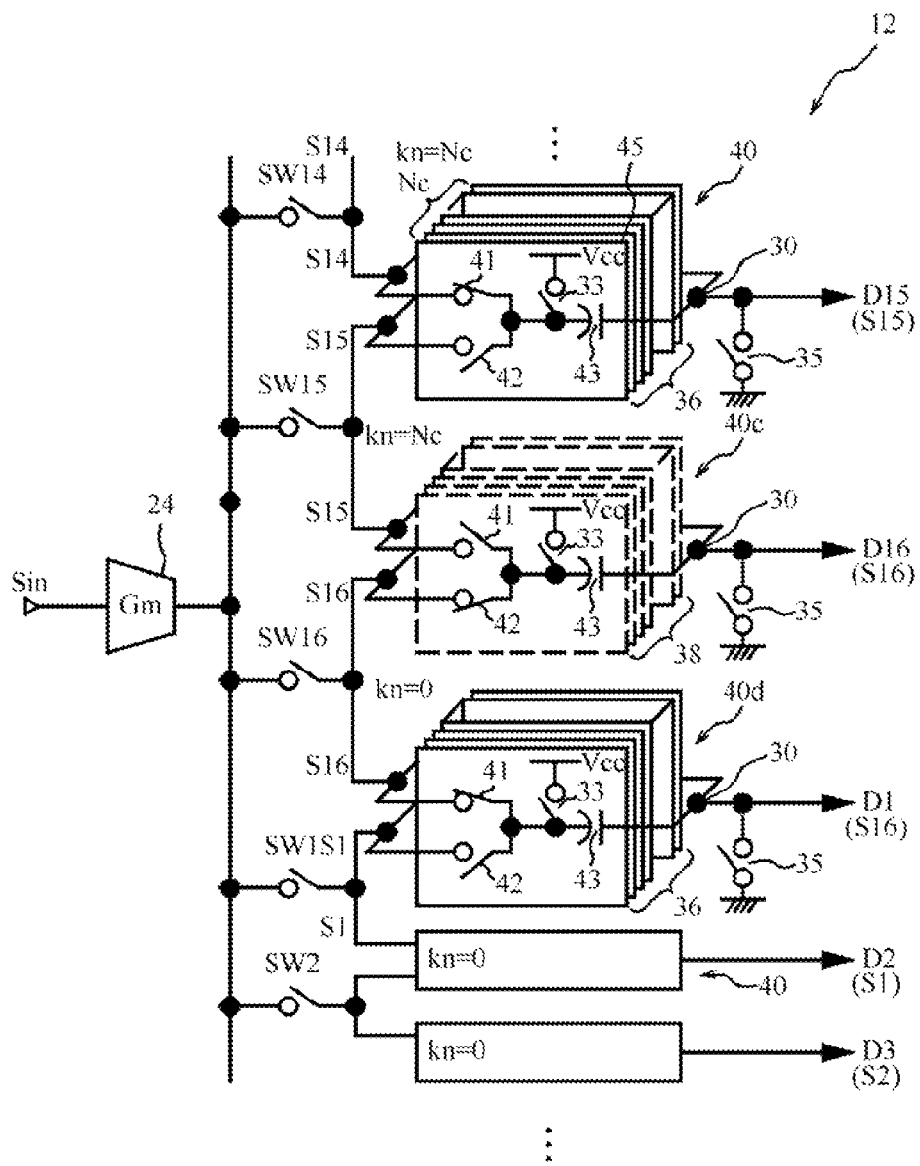
FIG. 15 is a diagram illustrating a case where the interpolation coefficient kn in the generation circuit is changed from Nc to 0.

Next, a description is given of a case where the interpolation coefficient kn in the generation circuit 12 is changed from Nc to 0. FIG. 15 is a diagram illustrating a case where the interpolation coefficient kn in the generation circuit 12 is changed from Nc to 0. The circuitry of FIG. 15 is the same as that of FIG. 11. It is assumed that the interpolation coefficient kn is changed from Nc to 0 between the capacitor circuits 40c and 40d, for example. In the capacitor circuit 40c, all capacitors 43 are connected to the switch SW16, and the capacitors 43 are not connected to the switch SW15. In the capacitor circuit 40d, all capacitors 43 are connected to the switch SW16, and the capacitors 43 are not connected to the switch SW1. Thereby, the interpolation data D16 outputted from the capacitor circuit 40c corresponds to the data S16, and the interpolation data D1 outputted from the capacitor circuit 40d also corresponds to the data S16. Therefore, the interpolation data corresponding to the data S16 are doubly generated. All capacitors 43 in the capacitor circuits 40c and 40d are connected to the switch SW16. Even if the currents which flow into the capacitor circuits 40c and 40d are the same value as the current which flows into other capacitor circuits 40, different voltages occur in the capacitor circuits 40c and 40d. Therefore, two data D16 and D1 which are the output of the capacitor circuits 40c and 40d become incorrect.

Thus, correct interpolation data are not generated when the generation circuit 12 having the plurality of capacitor circuits 40 generates the interpolation data doubly.

Figure 16:
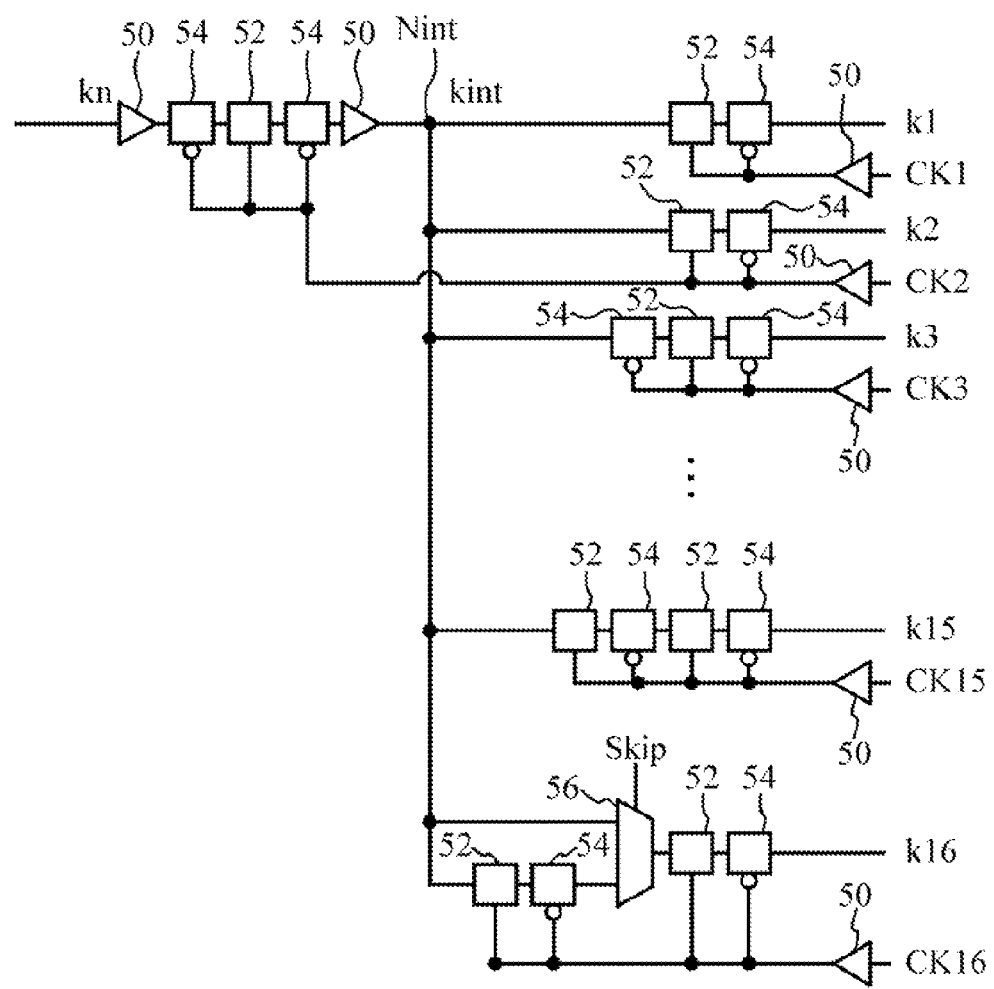
FIG. 16 is a diagram illustrating a part of a coefficient circuit.
Figure 17:
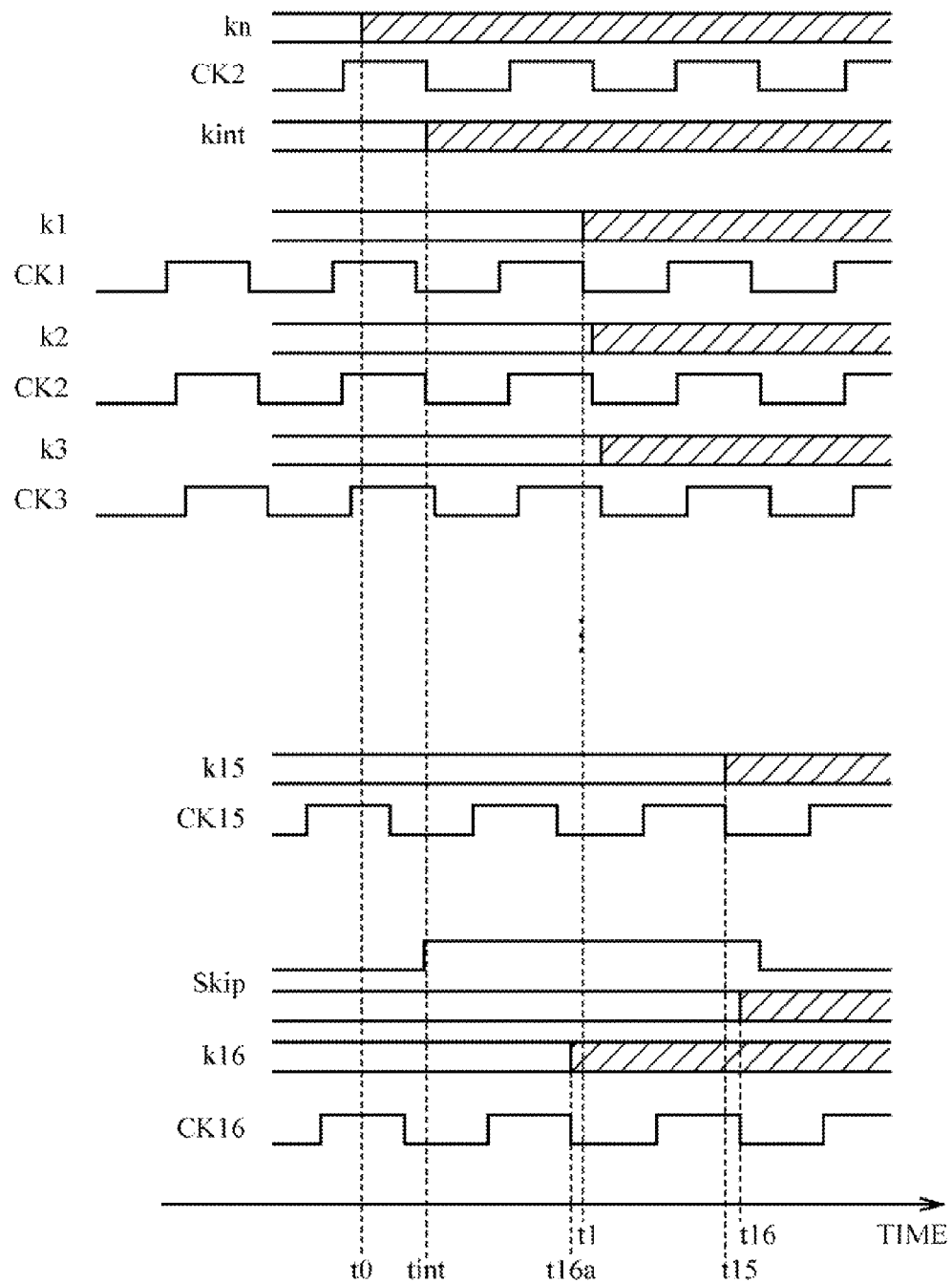
FIG. 17 is a timing chart of respective interpolation coefficients and clocks.

FIG. 16 is a diagram illustrating a part of the coefficient circuit 14. FIG. 17 is a timing chart of respective interpolation coefficients and clocks. The coefficient circuit 14 includes buffers 50, latches 52 and 54, and a selection circuit 56. A D-type flip-flop (DFF) is formed with the latches 52 and 54. The interpolation coefficient kn to be inputted is an interpolation coefficient that the calculation circuit 20 outputs to the coefficient circuit 14. The interpolation coefficients k1 to k16 are interpolation coefficients that the coefficient circuit 14 outputs to the capacitor circuits 40 in the generation circuit 12. Each boundary between a white area and a hatching area in the interpolation coefficients kn and k1 to k16 of FIG. 17 indicates timing in which each interpolation coefficient is changed.

The interpolation coefficient kn inputted to the coefficient circuit 14 is outputted, as an interpolation coefficient kint, to an intermediate node Nint via the buffer 50, the latches 52, 54 and 52, and the buffer 50. A clock CK2 is inputted to the latches 52 and 54. As illustrated in FIG. 17, the interpolation coefficient kn is inputted at a time t0. At a time tint, the interpolation coefficient kint is inputted to the intermediate node Nint in synchronization with falling of the clock CK2.

The interpolation coefficient kint is outputted as the interpolation coefficient k1 via the latches 52 and 54 to which a clock CK1 is inputted. At a time t1, the interpolation coefficient k1 is outputted in synchronization with the clock CK1, as illustrated in FIG. 17. The interpolation coefficient kint is outputted as the interpolation coefficient k2 via the latches 52 and 54 to which the clock CK2 is inputted. The interpolation coefficient k2 is outputted in synchronization with the clock CK2. The interpolation coefficient kint is outputted as the interpolation coefficient k3 via the latches 52 and 54 to which a clock CK3 is inputted. The interpolation coefficient k3 is outputted in synchronization with the clock CK3. The interpolation coefficient kint is outputted as the interpolation coefficient k15 via the latches 52, 54, 52 and 54 to which a clock CK15 is inputted. At a time t15, the interpolation coefficient k15 is outputted in synchronization with the clock CK15.

When the signal Skip is a high level, the selection circuit 56 directly inputs the interpolation coefficient kint from the intermediate node Nint. When the signal Skip is a low level, the selection circuit 56 inputs the interpolation coefficient kint from the intermediate node Nint via the latches 52 and 54 to which the clock CK16 is inputted. Thereby, when the signal Skip is the low level, the interpolation coefficient kint is outputted as the interpolation coefficient k16 via the latches 52, 54, 52 and 54 to which the clock CK16 is inputted. At a time t16, the interpolation coefficient k16 is outputted in synchronization with the clock CK16. On the other hand, when the signal Skip is the high level, the interpolation coefficient kint is outputted as the interpolation coefficient k16 via the latches 52 and 54 to which the clock CK16 is inputted. At a time t16a, the interpolation coefficient k16 is outputted in synchronization with the clock CK16. Thus, when the signal Skip is the high level, the interpolation coefficient k16 can be outputted early by one cycle (i.e., one phase), compared with the case where the signal Skip is the low level.

Figures 18A, 18B:
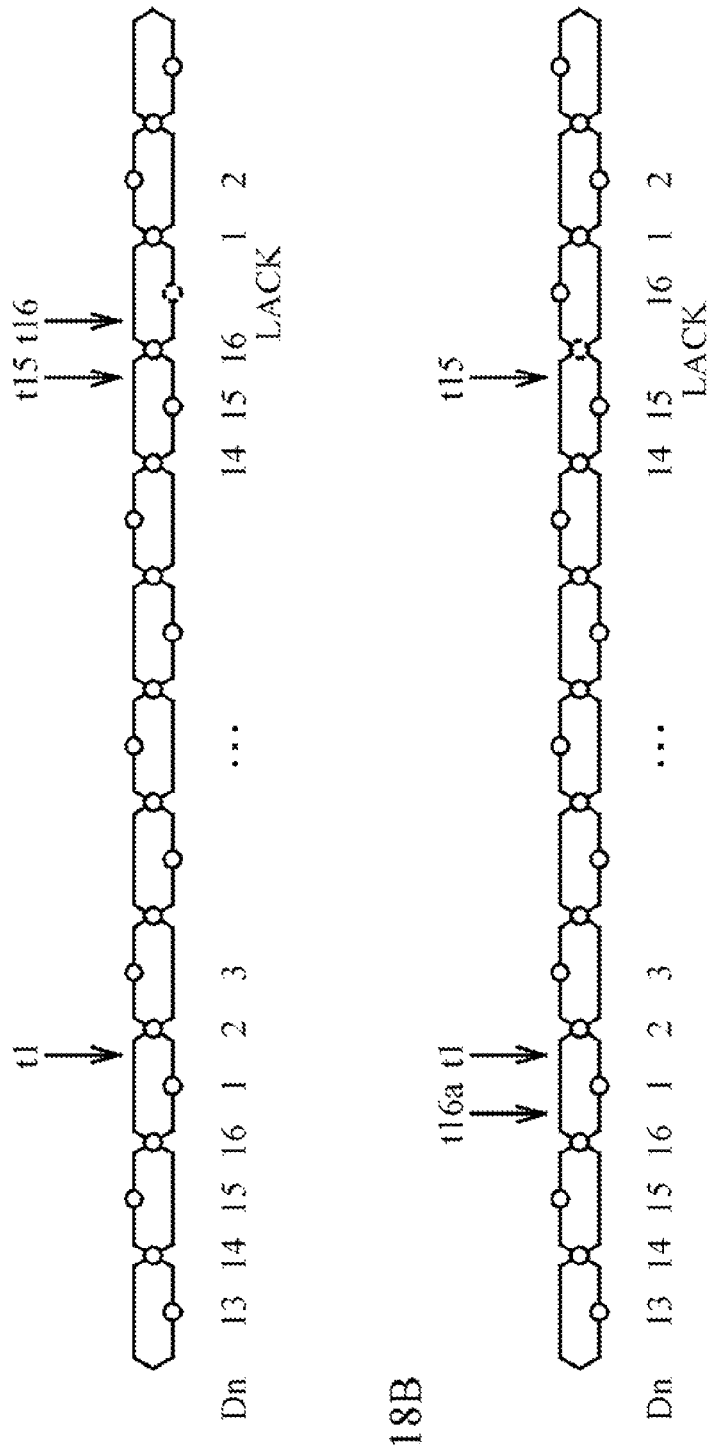
FIGS. 18A and 18B are diagrams illustrating a signal with respect to a time in timing when the interpolation coefficient kn is changed from 0 to Nc.

FIGS. 18A and 18B are diagrams illustrating a signal with respect to a time in timing when the interpolation coefficient kn is changed from 0 to Nc. At the time t1 between the interpolation data D1 and D2, the interpolation coefficient k1 is changed from 0 to Nc, as illustrated in FIG. 18A. Similarly, the interpolation coefficient k16 is changed from 0 to Nc at the time t16 after the interpolation data D16. In the first sampling after the update of the interpolation coefficient, the input data lacks. Therefore, the input data on the data point after the time t16 lacks.

When the signal Skip is the high level, the interpolation coefficient k16 is changed from 0 to Nc at the time t16a, as illustrated in FIG. 18B. In the first sampling after the update of the interpolation coefficient, the input data lacks. Therefore, the input data lacks between the interpolation data D15 and D16. The lacking input data is data on the transition point.

Figure 19:
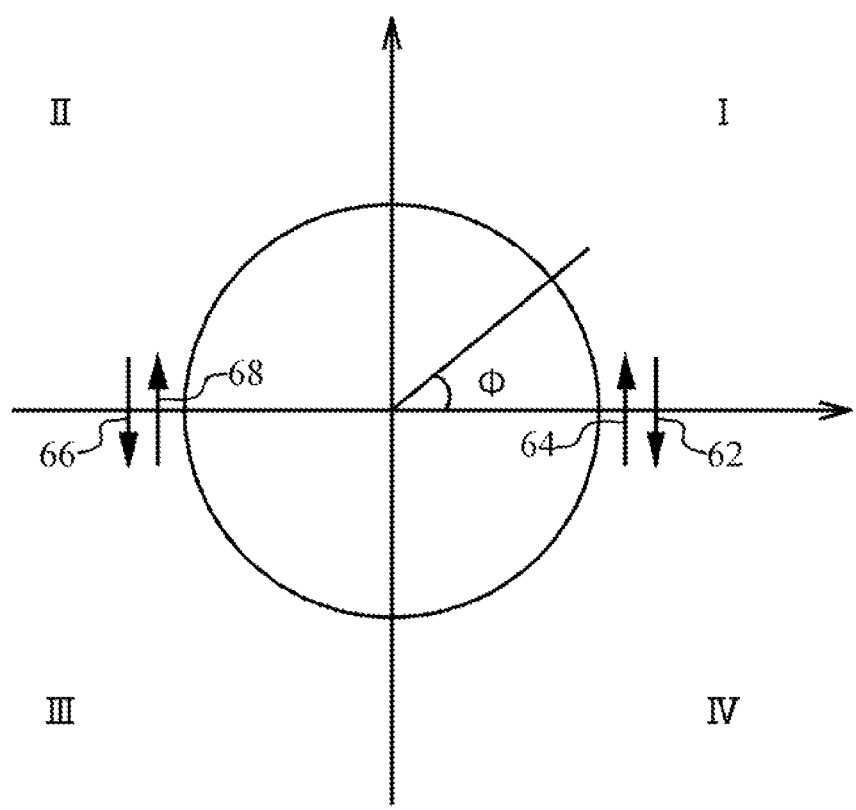
FIG. 19 is a diagram illustrating the phase of the interpolation coefficient.

Next, a description is given of a case where the detection circuit uses the interpolation code from the CDR (Clock Data Recovery) circuit of the 2× system, as the interpolation coefficient k. FIG. 19 is a diagram illustrating the phase of the coefficient circuit. FIG. 19 illustrates the interpolation code on a phase space outputted from the CDR circuit by setting one unit as 360 degrees. When the interpolation code Φ moves from a first quadrant to a fourth quadrant as indicated by an arrow 62, the interpolation coefficient k is changed from 0 to 1 and the input data lacks at the data point. When the interpolation code Φ moves from the fourth quadrant to the first quadrant as indicated by an arrow 64, the interpolation coefficient k is changed from 1 to 0 and the input data is doubly sampled at the data point. When the interpolation code Φ moves from the second quadrant to the third quadrant as indicated by an arrow 66, the interpolation coefficient k is changed from 0 to 1 and the input data lacks at the transition point. When the interpolation code Φ moves from the third quadrant to the second quadrant as indicated by an arrow 68, the interpolation coefficient k is changed from 1 to 0 and the input data is doubly sampled at the transition point. Table 1 is a table which summarized the above.

TABLE 1

| Quadrant of Phase | Phenomenon | Skip |
|---|---|---|
| IV –> I | Input data lacks at data point | 1 |
| I –> IV | Input data is doubly sampled at data point | 1 |
| II –> III | Input data lacks at transition point | 0 |
| III –> II | Input data is doubly sampled at transition point | 0 |

Figure 20:
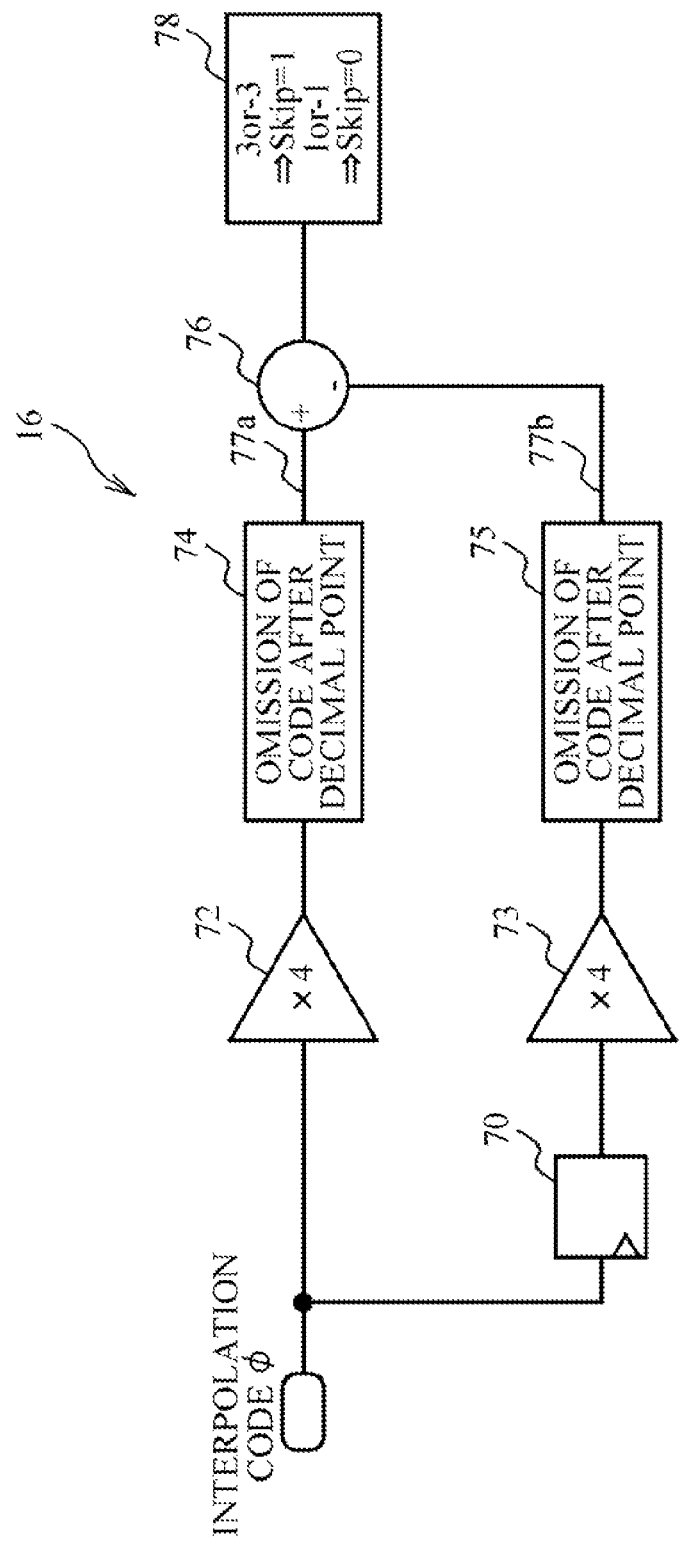
FIG. 20 is a diagram illustrating a logic of an example of the detection circuit.

FIG. 20 is a diagram illustrating a logic of an example of the detection circuit. The interpolation code Φ is inputted, as illustrated in FIG. 20. The interpolation code Φ is normalized at 360 degrees, and is more than or equal to 0 and less than or equal to 1. The interpolation code Φ is divided into two. A quadrupler circuit 72 quadruples one of the divided interpolation codes, and a logic circuit 74 omits the quadrupled interpolation code after a decimal point. Thereby, a signal on a channel 77a indicates the quadrant of the current interpolation code Φ. A DFF 70 delays another one of the divided interpolation codes by one clock. A quadrupler circuit 73 quadruples the another one of the divided interpolation codes, and a logic circuit 75 omits the quadrupled interpolation code after a decimal point. Thereby, a signal on a channel 77b indicates the quadrant of the interpolation code Φ before one clock. An adder 76 adds to each other the signal on the channel 77a as positive and the signal on the channel 77b as negative. Thereby, the outputs of the adder 76 corresponding to the arrows 62, 64, 66, and 68 of FIG. 19 are 3, −3, 1, and −1, respectively. When the output of the adder 76 is 3 or −3, a logic circuit 78 sets the signal Skip as 1. Thereby, when the input data lacks at the data point or is doubly sampled at the data point, since the interpolation coefficient is changed, the position for changing the interpolation coefficient can be changed from the data point to the transition point. When the output of the adder 76 is 1 or −1, the logic circuit 78 sets the signal Skip as 0. Thereby, when the input data lacks at the transition point or is doubly sampled at the transition point, since the interpolation coefficient is changed, the position for changing the interpolation coefficient is maintained, i.e., the transition point.

According to the second embodiment, when the detection circuit 16 detects the lack of the input data, the coefficient circuit 14 skips the position for changing the interpolation coefficient k to the transition point, as illustrated in FIG. 20. Thereby, the influence of the input data to be lacked can be reduced.

Also, the detection circuit 16 detects that the interpolation data are doubly generated from the input data at the data point, as illustrated in FIG. 20. When the detection circuit 16 detects that the interpolation data are doubly generated from the input data, the coefficient circuit 14 skips the position for changing the interpolation coefficient to the transition point. When the interpolation data are doubly generated as illustrated in FIG. 15, the interpolation data may be incorrect. According to the second embodiment, more correct interpolation data can be generated.

As illustrated in FIG. 11, the generation circuit 12 includes a plurality of unit circuits (i.e., capacitor circuits) that generates the plurality of pieces of interpolation data continuous in time series, respectively. Thereby, the interpolation data can be generated continuously.

When the generation circuit 12 makes the input data lack as illustrated in FIG. 14, the generation circuit 12 does not use the output of one of the capacitor circuits 40 as the interpolation data. Thereby, the generation circuit 12 can make the input data lack.

When the coefficient circuit 14 skips the position for changing the interpolation coefficient to the transition point, the coefficient circuit 14 skips the position for changing the interpolation coefficient for each given data interval, as illustrated in FIGS. 16 and 18. Thereby, the position for changing the interpolation coefficient can be easily changed from the data point to the transition point.

The detection circuit 16 detects the lack of the input data based on a phase of the interpolation coefficient, as illustrated in FIGS. 19 and 20. Thereby, the detection circuit 16 can easily detect the lack of the input data.

Figure 21:
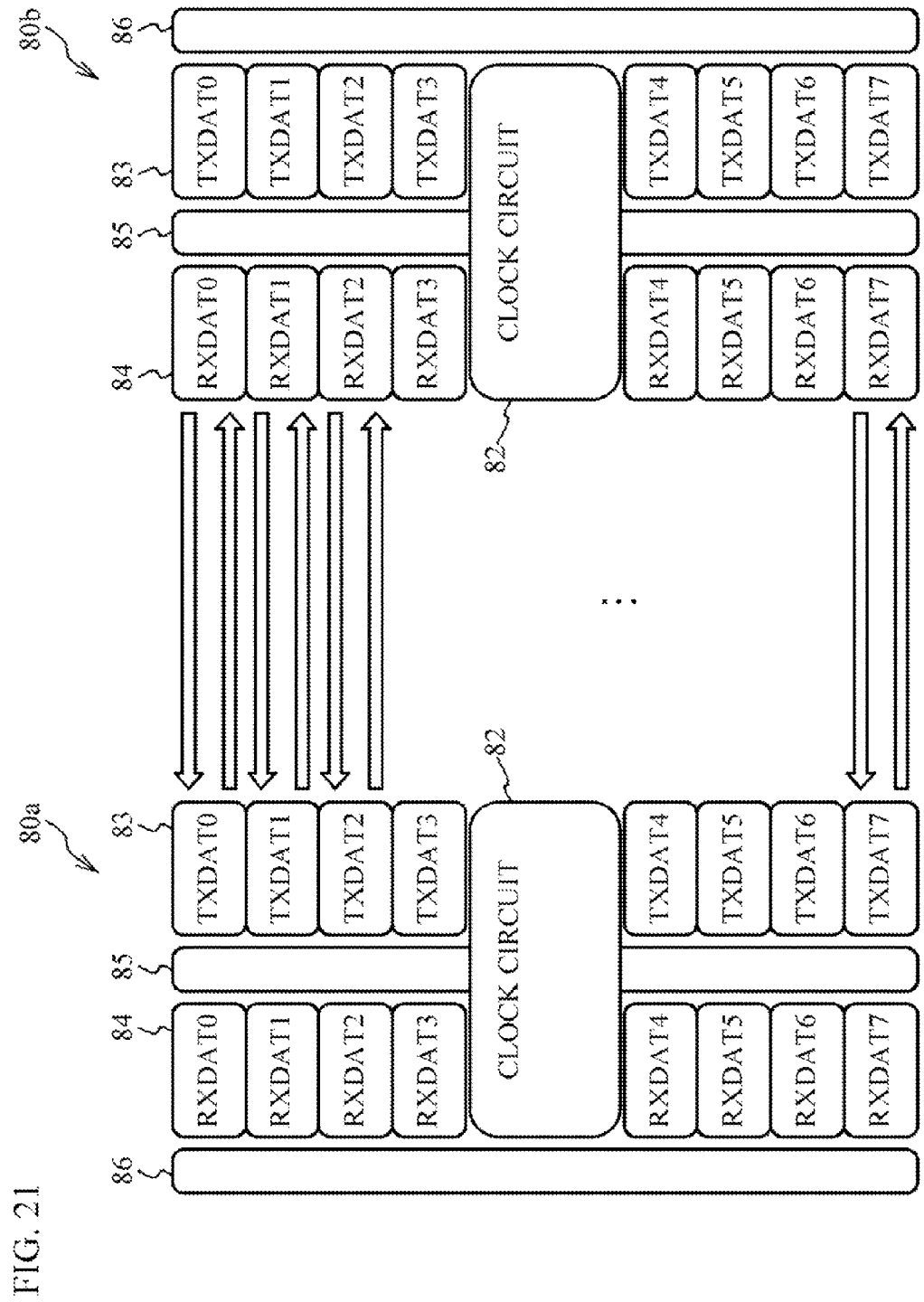
FIG. 21 is a block diagram illustrating an example of transmitting and receiving devices used for the first and the second embodiments.

FIG. 21 is a block diagram illustrating an example of transmitting and receiving devices used for the first and the second embodiments. Each of the transmitting and receiving devices 80a and 80b includes a clock circuit 82, a plurality of transmitting circuits 83, a plurality of receiving circuits 84, a clock distribution circuit 85, and a core interface 86. The clock circuit 82 generates clocks. Each transmitting circuit 83 transmits a signal to a corresponding receiving circuit 84 of another one of the transmitting and receiving devices 80a and 80b. Each receiving circuit 84 receives the transmitted signal from a corresponding transmitting circuit 83 of another one of the transmitting and receiving devices 80a and 80b. The clock distribution circuit 85 distributes the clocks generated by the clock circuit 82 to each transmitting circuit 83 and each receiving circuit 84. The core interface 86 inputs and outputs the transmitted signal and the received signal to a core device. The single transmitting circuit 83 and the single receiving circuit 84 are a set, and transmit and receive simultaneously the signals between the transmitting and receiving devices 80a and 80b. The receiving circuit using the interpolation circuit of the first and the second embodiments can be used as the receiving circuit of such a transmitting and receiving device.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment of the present invention has been described in detail, it should be understood that the various change, substitutions, and alterations could be made hereto without departing from the spirit and scope of the invention.

What is claimed is:

1. An interpolation circuit comprising:
 a generation circuit that generates interpolation data from a plurality of pieces of input data, using an interpolation coefficient, among input data inputted in time series including a data point and a transition point;
 a detection circuit that detects that the input data lacks at the data point; and
 a coefficient circuit that changes the interpolation coefficient for each given data interval, and skips a position for changing the interpolation coefficient to the transition point when the detection circuit detects the lack of the input data.

2. The interpolation circuit as claimed in claim 1, wherein
the detection circuit detects that the interpolation data are doubly generated from the input data at the data point, and
the coefficient circuit skips the position for changing the interpolation coefficient to the transition point when the detection circuit detects that the interpolation data are doubly generated from the input data.

3. The interpolation circuit as claimed in claim 1, wherein the generation circuit includes a plurality of unit circuits that generates the plurality of pieces of interpolation data continuous in time series, respectively.

4. The interpolation circuit as claimed in claim 3, wherein when the generation circuit makes the input data lack, the generation circuit does not use output of one of the unit circuits as the interpolation data.

5. The interpolation circuit as claimed in claim 1, wherein the detection circuit detects the lack of the input data based on a phase of the interpolation coefficient.

6. The interpolation circuit as claimed in claim 1, wherein
the generation circuit includes a capacitor circuit that generates the interpolation data,
the capacitor circuit includes a first variable capacitor and a second variable capacitor that are capable of changing capacitance values according to the interpolation coefficient, and
the interpolation data is formed by applying currents corresponding to the plurality of pieces of input data to the first and the second variable capacitors in timing when the first variable capacitor is earlier than the second variable capacitor, and synthesizing electric charges of the first and the second variable capacitors.

7. The interpolation circuit as claimed in claim 6, wherein
the generation circuit includes a plurality of capacitor circuits corresponding to the plurality of pieces of input data within the given data interval, and
a current is applied at the same time to the second variable capacitor of one capacitor circuit among two capacitor circuits corresponding to adjacent data inputted in time series, and the first variable capacitor of another capacitor circuit among the two capacitor circuits, the one capacitor circuit corresponding to early data in the adjacent data inputted in time series.

8. A receiving circuit comprising:
an interpolation circuit including:
    a generation circuit that generates interpolation data from a plurality of pieces of input data, using an interpolation coefficient, among input data inputted in time series including a data point and a transition point;
    a detection circuit that detects that the input data lacks at the data point; and
    a coefficient circuit that changes the interpolation coefficient for each given data interval, and skips a position for changing the interpolation coefficient to the transition point when the detection circuit detects the lack of the input data; and
a calculation circuit that calculates the interpolation coefficient using interpolation data on the transition point.

* * * * *